(12) United States Patent
Schediwy et al.

(10) Patent No.: US 10,444,862 B2
(45) Date of Patent: Oct. 15, 2019

(54) LOW-PROFILE CAPACITIVE POINTING STICK

(71) Applicant: Synaptics Incorporated, San Jose, CA (US)

(72) Inventors: Richard Schediwy, Union City, CA (US); Douglas M. Krumpelman, Hayden, ID (US); Mihai Bulea, San Jose, CA (US); Joseph Kurth Reynolds, Alviso, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 406 days.

(21) Appl. No.: 14/466,600

(22) Filed: Aug. 22, 2014

(65) Prior Publication Data
US 2016/0054813 A1   Feb. 25, 2016

(51) Int. Cl.
| | |
|---|---|
| G06F 3/0338 | (2013.01) |
| G06F 3/044 | (2006.01) |
| G06F 3/0354 | (2013.01) |
| H03K 17/98 | (2006.01) |

(52) U.S. Cl.
CPC ........ *G06F 3/0338* (2013.01); *G06F 3/03543* (2013.01); *G06F 3/044* (2013.01); *H03K 17/98* (2013.01)

(58) Field of Classification Search
CPC ..... G06F 3/0338; G06F 3/03543; G06F 3/044
See application file for complete search history.

(56) References Cited

U.S. PATENT DOCUMENTS

| | | |
|---|---|---|
| 4,103,252 A | 7/1978 | Bobick |
| 4,113,378 A | 9/1978 | Wirtz |
| 4,422,035 A | 12/1983 | Risko |
| 4,719,455 A | 1/1988 | Louis |
| 4,719,538 A | 1/1988 | Cox |
| 4,736,191 A | 4/1988 | Matzke et al. |
| 4,831,325 A | 5/1989 | Watson, Jr. |
| 5,012,231 A | 4/1991 | Felsenstein |
| 5,287,121 A | 2/1994 | Louis et al. |

(Continued)

FOREIGN PATENT DOCUMENTS

| | | |
|---|---|---|
| CN | 101427468 A | 5/2009 |
| CN | 102187236 A | 9/2011 |

(Continued)

OTHER PUBLICATIONS

Cheng, et al. "A Polymer-Based Capacitive Sensing Array for Normal and Shear Force Measurement" http://www.ncbi.nlm.nih.gov/pmc/articles/PMC3230994, Published on line Nov. 15, 2010. Dept of Mechanical Engineering, National Taiwan University, Taipei, Taiwan.

*Primary Examiner* — Kenneth Bukowski
(74) *Attorney, Agent, or Firm* — Patterson + Sheridan, LLP

(57) ABSTRACT

In an example, an input device includes a substrate and an elastomeric material. The substrate includes a plurality of sensor electrodes disposed thereon. The elastomeric material is mechanically coupled to the substrate and overlaps the plurality of sensor electrodes. The elastomeric material includes an inner portion disposed such that an area of contact between the inner portion and at least some of the plurality of sensor electrodes changes in response to at least one of a lateral force or a vertical force applied to the elastomeric material.

20 Claims, 11 Drawing Sheets

(56) References Cited

U.S. PATENT DOCUMENTS

| | | | |
|---|---|---|---|
| 5,305,017 A | 4/1994 | Gerpheide |
| 5,374,787 A | 12/1994 | Miller et al. |
| 5,489,922 A | 2/1996 | Zloof |
| 5,495,077 A | 2/1996 | Miller et al. |
| 5,521,596 A | 5/1996 | Selker et al. |
| 5,541,622 A | 7/1996 | Engle et al. |
| 5,543,590 A | 8/1996 | Gillespie et al. |
| 5,576,704 A | 11/1996 | Baker et al. |
| 5,648,642 A | 7/1997 | Miller et al. |
| 5,696,535 A | 12/1997 | Rutledge et al. |
| 5,781,178 A | 7/1998 | Roehm et al. |
| 5,786,997 A | 7/1998 | Hoyt et al. |
| 5,841,078 A | 11/1998 | Miller et al. |
| 5,854,625 A | 12/1998 | Frisch et al. |
| 5,861,583 A | 1/1999 | Schediwy et al. |
| 5,889,507 A | 3/1999 | Engle et al. |
| 5,914,465 A | 6/1999 | Allen et al. |
| 5,920,310 A | 7/1999 | Faggin et al. |
| 5,942,733 A | 8/1999 | Allen et al. |
| 5,943,052 A | 8/1999 | Allen et al. |
| 5,945,980 A | 8/1999 | Moissev et al. |
| 5,949,354 A | 9/1999 | Chang |
| 5,956,018 A | 9/1999 | Pejic et al. |
| 5,973,668 A | 10/1999 | Watanabe |
| 6,184,865 B1 | 2/2001 | Zimmerman et al. |
| 6,184,871 B1 | 2/2001 | Teres et al. |
| 6,188,391 B1 | 2/2001 | Seely et al. |
| 6,204,838 B1 | 3/2001 | Wang et al. |
| 6,380,931 B1 | 4/2002 | Gillespie et al. |
| 6,400,354 B1 | 6/2002 | Pin-Chien |
| 6,414,671 B1 | 7/2002 | Gillespie et al. |
| 6,448,911 B1 | 9/2002 | Somayajula |
| 6,480,183 B1 | 11/2002 | Van Ruymbeke et al. |
| 6,508,137 B2 | 1/2003 | Suzuki |
| 6,570,557 B1 | 5/2003 | Westerman et al. |
| 6,583,632 B2 | 6/2003 | Von Basse et al. |
| 6,587,093 B1 | 7/2003 | Shaw et al. |
| 6,610,936 B2 | 8/2003 | Gillespie et al. |
| 6,642,857 B1 * | 11/2003 | Schediwy ............ G06F 3/0338 341/20 |
| 6,667,740 B2 | 12/2003 | Ely et al. |
| 6,677,932 B1 | 1/2004 | Westerman |
| 6,750,852 B2 | 6/2004 | Gillespie et al. |
| 6,756,703 B2 | 6/2004 | Chang |
| 6,781,577 B2 | 8/2004 | Shigetaka |
| 6,809,275 B1 | 10/2004 | Cheng et al. |
| 6,825,673 B1 | 11/2004 | Yamaoka |
| 6,831,629 B2 | 12/2004 | Nishino et al. |
| 6,879,930 B2 | 4/2005 | Sinclair et al. |
| 6,888,076 B2 | 5/2005 | Hetherington |
| 6,888,538 B2 | 5/2005 | Ely et al. |
| 6,922,063 B2 | 7/2005 | Heger |
| 6,946,853 B2 | 9/2005 | Gifford et al. |
| 7,006,078 B2 | 2/2006 | Kim |
| 7,040,182 B2 | 5/2006 | Teraoka |
| 7,050,927 B2 | 5/2006 | Sinclair et al. |
| 7,068,039 B2 | 6/2006 | Parker |
| 7,075,316 B2 | 7/2006 | Umeda et al. |
| 7,084,854 B1 | 8/2006 | Moore et al. |
| 7,098,675 B2 | 8/2006 | Inaba et al. |
| 7,129,928 B2 | 10/2006 | Young et al. |
| 7,138,977 B2 | 11/2006 | Kinerk et al. |
| 7,151,431 B2 | 12/2006 | Ooba et al. |
| 7,158,125 B2 | 1/2007 | Sinclair et al. |
| 7,212,189 B2 | 5/2007 | Shaw et al. |
| 7,274,353 B2 | 9/2007 | Chiu et al. |
| 7,476,952 B2 | 1/2009 | Vaganov et al. |
| 7,504,833 B1 | 3/2009 | Seguine |
| 7,521,921 B2 | 4/2009 | Zhu et al. |
| 7,554,167 B2 | 6/2009 | Vaganov |
| 7,598,822 B2 | 10/2009 | Rajagopal et al. |
| 7,602,376 B1 | 10/2009 | Hetherington |
| 7,699,755 B2 | 4/2010 | Feldman et al. |
| 7,721,609 B2 | 5/2010 | Wright |
| 7,727,117 B2 | 6/2010 | Feldman et al. |
| 7,735,383 B2 | 6/2010 | Dattalo et al. |
| 7,737,724 B2 | 6/2010 | Snyder et al. |
| 7,761,845 B1 | 7/2010 | Perrin et al. |
| 7,765,095 B1 | 7/2010 | Nemecek |
| 7,770,113 B1 | 8/2010 | Anderson et al. |
| 7,772,657 B2 | 8/2010 | Vaganov |
| 7,774,190 B1 | 8/2010 | Nemecek |
| 7,791,151 B2 | 9/2010 | Vaganov et al. |
| 7,812,825 B2 | 10/2010 | Sinclair et al. |
| 7,825,688 B1 | 11/2010 | Snyder et al. |
| 7,839,383 B2 | 11/2010 | Li et al. |
| 7,844,437 B1 | 11/2010 | Ogami et al. |
| 7,880,247 B2 | 2/2011 | Vaganov et al. |
| 7,884,621 B2 | 2/2011 | Snyder |
| 7,893,724 B2 | 2/2011 | Moyal et al. |
| 7,921,728 B2 | 4/2011 | Dallenbach et al. |
| 7,990,160 B2 | 8/2011 | Reynolds |
| 8,004,052 B2 | 8/2011 | Vaganov |
| 8,026,739 B2 | 9/2011 | Sullam et al. |
| 8,040,142 B1 | 10/2011 | Bokma et al. |
| 8,040,266 B2 | 10/2011 | Thiagarajan et al. |
| 8,040,321 B2 | 10/2011 | Peng et al. |
| 8,049,569 B1 | 11/2011 | Wright et al. |
| 8,053,267 B2 | 11/2011 | Vaganov |
| 8,058,937 B2 | 11/2011 | Qin et al. |
| 8,067,948 B2 | 11/2011 | Sequine |
| 8,069,405 B1 | 11/2011 | Bartz et al. |
| 8,069,428 B1 | 11/2011 | Ogami et al. |
| 8,069,436 B2 | 11/2011 | Snyder et al. |
| 8,078,894 B1 | 12/2011 | Ogami |
| 8,078,970 B1 | 12/2011 | Anderson |
| 8,085,067 B1 | 12/2011 | Stiff |
| 8,085,100 B2 | 12/2011 | Brennan |
| 8,086,417 B2 | 12/2011 | Seguine |
| 8,089,288 B1 | 1/2012 | Maharita |
| 8,089,289 B1 | 1/2012 | Kremin et al. |
| 8,089,461 B2 | 1/2012 | Beard et al. |
| 8,089,472 B2 | 1/2012 | XiaoPing et al. |
| 8,092,083 B2 | 1/2012 | Venkataraman et al. |
| 8,103,496 B1 | 1/2012 | Roe et al. |
| 8,103,497 B1 | 1/2012 | Nemecek et al. |
| 8,120,408 B1 | 2/2012 | Sivadasan et al. |
| 8,125,445 B1 | 2/2012 | Anderson |
| 8,130,025 B2 | 3/2012 | Kutz |
| 8,144,126 B2 | 3/2012 | Wright |
| 8,149,048 B1 | 4/2012 | Mar |
| 8,159,462 B1 | 4/2012 | Seguine |
| 8,160,864 B1 | 4/2012 | Nemecek et al. |
| 8,169,238 B1 | 5/2012 | Maharyta et al. |
| 8,169,413 B2 | 5/2012 | Jin et al. |
| 8,176,296 B2 | 5/2012 | Snyder |
| 8,183,077 B2 | 5/2012 | Vaganov et al. |
| 8,220,343 B2 | 7/2012 | Hatanaka et al. |
| 8,274,479 B2 * | 9/2012 | Prest .................... G06F 3/0338 200/5 R |
| 8,286,125 B2 | 10/2012 | McDonald et al. |
| 8,315,832 B1 | 11/2012 | Seguine |
| 8,321,174 B1 | 11/2012 | Moyal et al. |
| 8,350,345 B2 | 1/2013 | Vaganov |
| 8,358,142 B2 | 1/2013 | Maharyta |
| 8,358,150 B1 | 1/2013 | Snyder et al. |
| 8,358,226 B2 | 1/2013 | Reynolds et al. |
| 8,363,031 B2 | 1/2013 | Geaghan |
| 8,370,791 B2 | 2/2013 | Ogami et al. |
| 8,402,313 B1 | 3/2013 | Pleis et al. |
| 8,411,066 B2 | 4/2013 | Cordeiro et al. |
| 8,462,107 B2 | 6/2013 | Fairweather et al. |
| 8,476,928 B1 | 7/2013 | Sullam et al. |
| 8,487,639 B1 | 7/2013 | Walsh et al. |
| 8,487,788 B2 | 7/2013 | Reynolds et al. |
| 8,487,912 B1 | 7/2013 | Peterson |
| 8,493,351 B2 | 7/2013 | Peng et al. |
| 8,493,358 B2 | 7/2013 | Rebeschi et al. |
| 8,499,270 B1 | 7/2013 | Best et al. |
| 8,516,025 B2 | 8/2013 | Synder et al. |
| 8,525,798 B2 | 9/2013 | Peterson et al. |
| 8,527,949 B1 | 9/2013 | Pleis et al. |
| 8,533,677 B1 | 9/2013 | Pleis et al. |
| 8,536,902 B1 | 9/2013 | Maharyta et al. |

(56) References Cited

U.S. PATENT DOCUMENTS

| | | |
|---|---|---|
| 8,537,121 B2 | 9/2013 | XiaoPing |
| 8,547,114 B2 | 10/2013 | Kremin |
| 8,555,032 B2 | 10/2013 | Snyder |
| 8,570,052 B1 | 10/2013 | Mahartya |
| 8,570,053 B1 | 10/2013 | Ryshtun et al. |
| 8,575,947 B1 | 11/2013 | Walsh et al. |
| 8,618,428 B2 | 12/2013 | Bulea |
| 8,692,563 B1 | 4/2014 | Maharyta |
| 8,717,042 B1 | 5/2014 | Seguine |
| 8,736,303 B2 | 5/2014 | Snyder et al. |
| 8,766,946 B2 | 7/2014 | Kanda et al. |
| 8,773,366 B2 | 7/2014 | Hable et al. |
| 8,793,635 B1 | 7/2014 | Ogami et al. |
| 8,803,813 B2 | 8/2014 | XiaoPing et al. |
| 8,836,657 B2 | 9/2014 | Yamamoto et al. |
| 8,866,500 B2 | 10/2014 | Kremin et al. |
| 8,890,841 B2 | 11/2014 | Rebeschi et al. |
| 8,901,944 B2 | 12/2014 | Chai et al. |
| 8,902,173 B2 | 12/2014 | Seguine |
| 8,909,960 B1 | 12/2014 | Ogami |
| 8,941,393 B2 | 1/2015 | Young |
| 8,976,124 B1 | 3/2015 | Wright |
| 9,024,907 B2 | 5/2015 | Bolender |
| 9,034,666 B2 | 5/2015 | Vaganov et al. |
| 9,041,418 B2 | 5/2015 | Hsieh et al. |
| 9,052,790 B2 * | 6/2015 | Yairi ................ G06F 3/04895 |
| 9,057,653 B2 | 6/2015 | Schediwy et al. |
| 9,104,273 B1 | 8/2015 | Olson et al. |
| 9,152,284 B1 | 10/2015 | Peng et al. |
| 9,154,160 B2 | 10/2015 | Kremin |
| 9,166,621 B2 | 10/2015 | Kremin |
| 9,176,630 B2 | 11/2015 | Westhues et al. |
| 2001/0007449 A1 | 7/2001 | Kobachi et al. |
| 2001/0011994 A1 * | 8/2001 | Morimoto .............. G06F 3/0338 345/156 |
| 2002/0190727 A1 * | 12/2002 | Morimoto ................ E02B 3/00 324/644 |
| 2003/0091220 A1 | 5/2003 | Sato et al. |
| 2003/0222660 A1 * | 12/2003 | Morimoto ............... G01L 1/142 324/661 |
| 2004/0017355 A1 | 1/2004 | Shim |
| 2004/0099513 A1 | 5/2004 | Hetherington |
| 2004/0135765 A1 | 7/2004 | Kinerk et al. |
| 2004/0196270 A1 | 10/2004 | Chiu et al. |
| 2004/0239535 A1 | 12/2004 | Chadwell et al. |
| 2004/0252109 A1 | 12/2004 | Trent et al. |
| 2005/0031175 A1 | 2/2005 | Hara et al. |
| 2005/0057501 A1 | 3/2005 | Young et al. |
| 2005/0062732 A1 | 3/2005 | Sinclair et al. |
| 2005/0099393 A1 | 5/2005 | Johnson |
| 2005/0190152 A1 | 9/2005 | Vaganov |
| 2006/0022937 A1 | 2/2006 | Matta et al. |
| 2006/0066582 A1 | 3/2006 | Lyon et al. |
| 2006/0087314 A1 | 4/2006 | Zhu et al. |
| 2006/0097991 A1 | 5/2006 | Hotelling et al. |
| 2006/0205565 A1 | 9/2006 | Feldman et al. |
| 2006/0217243 A1 | 9/2006 | Feldman et al. |
| 2006/0238205 A1 | 10/2006 | Francis |
| 2006/0238514 A1 | 10/2006 | Rosenberg et al. |
| 2006/0267933 A1 | 11/2006 | Tai et al. |
| 2007/0046651 A1 | 3/2007 | Sinclair et al. |
| 2007/0155589 A1 | 7/2007 | Feldman et al. |
| 2007/0247423 A1 | 10/2007 | Harley et al. |
| 2007/0262962 A1 | 11/2007 | XiaoPing et al. |
| 2007/0298883 A1 | 12/2007 | Feldman et al. |
| 2008/0042995 A1 | 2/2008 | Li et al. |
| 2008/0078590 A1 | 4/2008 | Sequine |
| 2008/0083962 A1 | 4/2008 | Vaganov |
| 2008/0111714 A1 | 5/2008 | Kremin |
| 2008/0146336 A1 | 6/2008 | Feldman et al. |
| 2008/0191715 A1 | 8/2008 | Schediwy et al. |
| 2009/0237373 A1 | 9/2009 | Hansson |
| 2009/0260898 A1 | 10/2009 | Jin et al. |
| 2009/0273578 A1 | 11/2009 | Kanda et al. |
| 2010/0077868 A1 * | 4/2010 | Joung .................... G01L 1/205 73/862.046 |
| 2010/0170349 A1 | 7/2010 | Hatanaka et al. |
| 2011/0095919 A1 * | 4/2011 | Ostermoller ........... G06F 3/044 341/33 |
| 2011/0153243 A1 | 6/2011 | Modafe |
| 2011/0278078 A1 * | 11/2011 | Schediwy ............... G01L 1/146 178/18.06 |
| 2011/0316567 A1 | 12/2011 | Chai et al. |
| 2012/0182257 A1 | 7/2012 | Yamamoto et al. |
| 2013/0038531 A1 | 2/2013 | Chen |
| 2013/0241579 A1 | 9/2013 | Takahashi |
| 2014/0160063 A1 * | 6/2014 | Yairi ....................... G06F 3/044 345/174 |
| 2015/0137310 A1 * | 5/2015 | Fillmore ............. H01L 21/7682 257/522 |
| 2015/0280707 A1 * | 10/2015 | Hovden ............. H03K 17/9622 341/33 |

FOREIGN PATENT DOCUMENTS

| | | |
|---|---|---|
| EP | 2241955 A1 | 10/2010 |
| WO | 2010036545 A2 | 4/2010 |
| WO | 2010040049 A1 | 4/2010 |
| WO | 2012067773 A1 | 5/2012 |
| WO | 2012096781 A2 | 7/2012 |

* cited by examiner

LOW-PROFILE CAPACITIVE POINTING STICK

BACKGROUND

Field of the Disclosure

Embodiments generally relate to input sensing and, in particular, to input sensing using a low-profile capacitive pointing stick.

Description of the Related Art

Electronic devices, such as computers, can include or be connected to various input devices for interacting with a user. Example input devices include keyboards, pointing devices, proximity sensor devices (also commonly called touchpads or touch sensor devices), and the like. Both a pointing device and a touchpad can be used to provide input interfaces to the electronic device. For example, a pointing device and/or touchpad allow the user to move a cursor or other type of user interface indicator on a display. A "pointing stick" is one type of pointing device used, for example, with desktop and notebook computers. A pointing stick is a small analog joystick, usually disposed between the keys of a keyboard, which the user can manipulate to provide input to the electronic device. In some electronic devices (e.g., notebook computers), a pointing stick can be provided as an input option alongside a touchpad.

SUMMARY

Embodiments generally provide an input device, a processing system, and method to control a user interface indicator of an electronic device. In an embodiment, an input device includes a substrate and an elastomeric material. The substrate includes a plurality of sensor electrodes disposed thereon. The elastomeric material is mechanically coupled to the substrate and overlaps the plurality of sensor electrodes. The elastomeric material includes an inner portion disposed such that an area of contact between the inner portion and at least some of the plurality of sensor electrodes changes in response to at least one of a lateral force or a vertical force applied to the elastomeric material.

In an embodiment, a processing system includes a sensor module and a determination module. The sensor module includes sensor circuitry and is configured to operate a plurality of sensor electrodes to sense input to the input device through an elastomeric material overlapping the plurality of sensor electrodes. The determination module is configured to control the user interface indicator based on the sensed input indicating a change in an area of contact between an inner portion of the elastomeric material and at least some of the plurality of sensor electrodes in response to at least one of a lateral force or a vertical force applied to the elastomeric material.

A method of operating an input device configured to control a user interface indicator of an electronic device includes: operating a plurality of sensor electrodes to sense input to the input device through an elastomeric material overlapping the plurality of sensor electrodes; and controlling the user interface indicator in based on the sensed input indicating a change in an area of contact between an inner portion of the elastomeric material and at least some of the plurality of sensor electrodes in response to at least one of a lateral force or a vertical force applied to the elastomeric material.

BRIEF DESCRIPTION OF THE DRAWINGS

So that the manner in which the above recited features of embodiments can be understood in detail, a more particular description of embodiments, briefly summarized above, may be had by reference to embodiments, some of which are illustrated in the appended drawings. It is to be noted, however, that the appended drawings illustrate only typical embodiments and are therefore not to be considered limiting of scope, for other equally effective embodiments may be admitted.

To facilitate understanding, identical reference numerals have been used, where possible, to designate identical elements that are common to the figures. It is contemplated that elements of one embodiment may be beneficially incorporated in other embodiments.

DETAILED DESCRIPTION

The following detailed description is merely exemplary in nature and is not intended to limit the embodiments or the application and uses of such embodiments. Furthermore, there is no intention to be bound by any expressed or implied theory presented in the preceding technical field, background, brief summary or the following detailed description.

Various embodiments provide for input sensing using a low-profile capacitive pointing stick. An input device implementing a capacitive pointing stick includes a low-profile elastomeric material mounted to a substrate. The elastomeric material includes a dielectric inner portion that overlaps sensor electrodes formed on the substrate. An input object deforms the elastomeric material over the sensor electrodes, changing the area of contact between the dielectric inner portion of the elastomeric material and the sensor electrodes. As the area of contact changes, the dielectric affecting some electric fields changes. The changing dielectric causes some capacitance measurements to increase. For example, a lateral force applied to the elastomeric material causes some capacitance measurements to increase with respect to other capacitance measurements. A vertical force applied to the elastomeric material causes all capacitance measurements to increase relative to no applied force. Various excitation schemes are described, including transcapacitive excitation schemes and absolute capacitive excitation schemes. Various sensor electrode structures are described in which three or more sensor electrodes are disposed on one or more layers/substrates beneath the elastomeric material. The resulting input device can have a low profile suitable for embedding in other low profile input devices (e.g., low profile keyboards). The resulting input device includes few components and has a relatively low manufacturing cost. These and further aspects are described further below.

Figure 1:
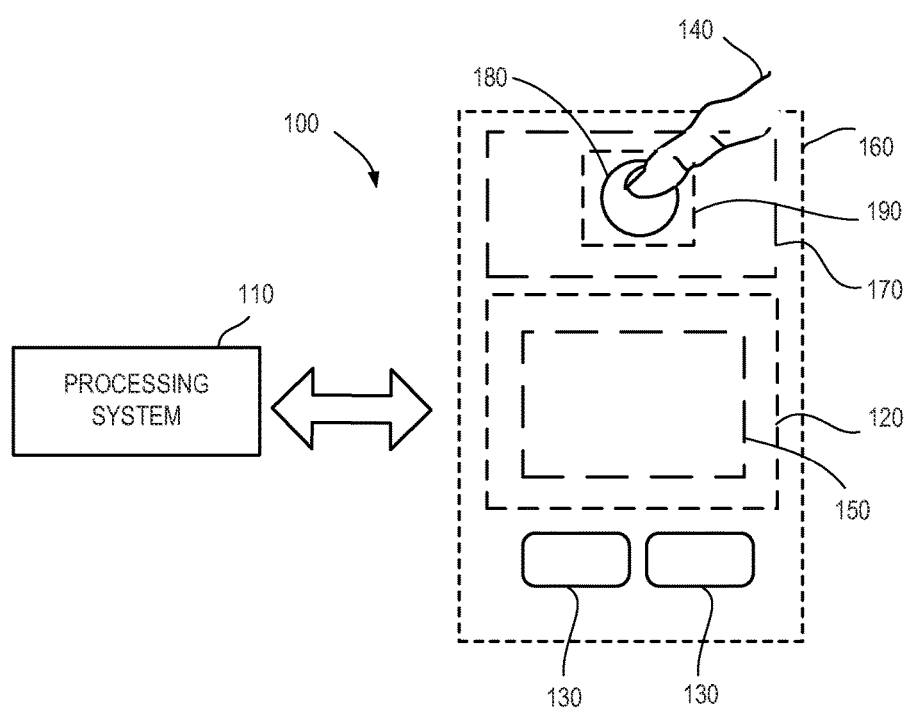
FIG. 1 is a block diagram of a system that includes an input device according to an example implementation.

Turning now to the figures, FIG. 1 is a block diagram of an exemplary input device 100 in accordance with embodiments. In various embodiments, the input device 100 comprises one or more sensing devices, each of which can be integrated in, or coupled to, an electronic device 160. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice) and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections (including serial and or parallel connections). Examples include I²C, SPI, PS/2, Universal Serial Bus (USB), Bluetooth, RF, and IRDA.

In the embodiment depicted in FIG. 1, the input device 100 includes one or more input devices, such as a pointing stick 180 and a proximity sensor device 150 (also often referred to as a "touchpad" or a "touch sensor device"), each of which is configured to sense input provided by input object(s) 140 (illustratively shown as a user's finger). Proximity sensor device 150 is configured to sense input object(s) 140 in a sensing region 120. The pointing stick 180 is configured to sense input object(s) 140 in a sensing region 190. In an embodiment, the pointing stick 180 is disposed within or alongside another device 170, such as a keyboard (e.g., the pointing stick 180 can be disposed between keys of a keyboard). Alternatively, the pointing stick 180 can be a "stand-alone" device separate and apart from any other input device. In some embodiments, the proximity sensor device 150 can be integrated into a display device (not shown) (e.g., a touch screen). In other embodiments, the proximity sensor device 150 can be a stand-alone device (e.g., a touchpad). In some embodiments, the proximity sensor device 150 is omitted.

Sensing regions 120, 190 encompass any space above, around, in, and/or near the input device 100 in which the input device 100 is able to detect user input (e.g., user input provided by input object(s) 140). The sizes, shapes, and locations of particular sensing regions may vary widely from embodiment to embodiment. In some embodiments, the sensing regions 120, 190 extend from a surface of the input device 100 in one or more directions into space until signal-to-noise ratios prevent sufficiently accurate object detection. The distance to which the sensing regions 120, 190 extend in a particular direction, in various embodiments, may be on the order of less than a millimeter, millimeters, centimeters, or more, and may vary significantly with the type of sensing technology used and the accuracy desired. Thus, in some embodiments, the proximity sensor device 150 and the pointing stick 180 sense input that comprises no contact with any surfaces of the input device 100, contact with an input surface (e.g., a touch surface) of the input device 100, contact with an input surface of the input device 100 coupled with some amount of applied force or pressure, and/or a combination thereof.

The input device 100 may utilize any combination of sensor components and sensing technologies to detect user input in the sensing regions 120, 190. The input device 100 comprises one or more sensing elements for detecting user input. Cursors, menus, lists, items, and other user interface indicators may be displayed as part of a graphical user interface and may be scaled, positioned, selected scrolled, or moved in response to sensed user input.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements, such as sensor electrodes, to create electric fields. In some capacitive implementations, separate sensing elements may be ohmically shorted together to form larger sensor electrodes. Some capacitive implementations utilize resistive sheets (e.g., may comprise a resistive material such as ITO or the like), which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing regions 120, 190. The proximity sensor device 150 and the pointing stick 180 generally include an array of sensing elements. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like. In some embodiments, components of the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may include software configured to run on a central processing unit of the desktop computer and one or more ICs (perhaps with associated firmware) separate from the central processing unit. As another example, the input device 100 may be physically integrated in an electronic device, and the processing system 110 may comprise circuits and firmware that are part of a main processor of the electronic device (e.g., a notebook computer). In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing regions 120, 190 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates sensing element(s) of the input device 100 to produce electrical signals indicative of input (or lack of input) in the sensing regions 120, 190. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

It should be understood that while many embodiments are described in the context of a fully functioning apparatus, the mechanisms of the embodiments are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2A:
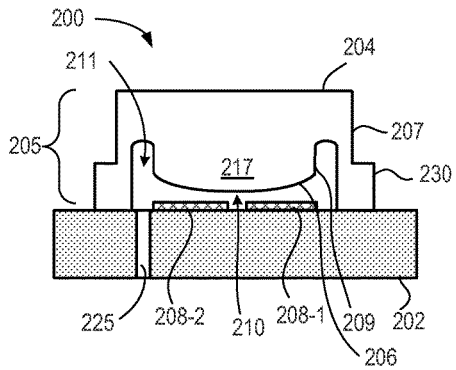
FIG. 2A is a cross-sectional, side view of an input device in accordance with embodiments.

FIG. 2A is a cross-sectional, side view of an input device 200 in accordance with embodiments. The input device 200 can be used as an embodiment of the pointing stick 180 shown in FIG. 1 to control a user interface indicator of an electronic device. The input device 200 includes a substrate 202 having sensor electrodes 208 disposed thereon (e.g., sensor electrodes 208-1 and 208-2 are shown in FIG. 2A), and an elastomeric material 205 mechanically coupled to the substrate 202 and overlapping the sensor electrodes 208. The substrate 202 can include one or more conductive layers (not shown) separated by one or more dielectric layers (not shown). For example, the substrate 202 can be all or part of a printed circuit board (PCB). The sensor electrodes 208 comprise a portion of a top conductive layer on the substrate 202. The sensor electrodes 208 are coupled to a processing system (e.g., the processing system 110) by traces (not shown) defined in the layer(s) of the substrate 202.

The elastomeric material 205 is generally cylindrical in shape having a top surface 204 and a side wall 207. A lower portion of the side wall 207 includes a flange 230 that interfaces with the substrate 202. The top surface 204 provides an input surface to interface with input object(s), such as a user's finger. The elastomeric material 205 includes an inner portion 217 that protrudes downward from the top surface 204 towards the sensor electrodes 208. The inner portion 217 can be generally cylindrical in shape having a convex bottom surface 206 and a side wall 209. Alternatively, the inner portion 217 can have a partial-spherical shape (e.g., hemispherical). The inner portion 217 is separated from the side wall 207 to form a cavity 211 that is filled with air. The bottom surface 206 of the inner portion 217 overlaps the sensor electrodes 208. At least the inner portion 217 of the elastomeric material 205 is a dielectric. The dielectric constant of the inner portion 217 can be greater than the air in the cavity 211.

Figure 2B:
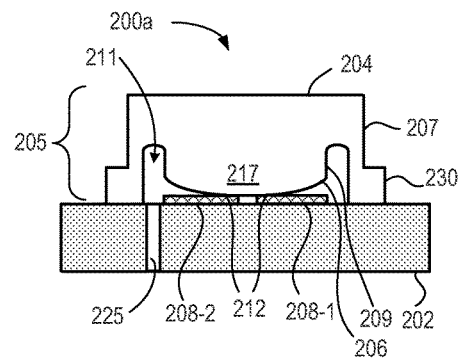
FIG. 2B is a cross-sectional, side view of another input device in accordance with embodiments.

In the example of FIG. 2A, absent vertical and/or lateral force on the top surface 204, the bottom surface 206 of the inner portion 217 is separated from the sensor electrodes 208 by a gap 210 (e.g., a portion of the cavity 211). Thus, in some examples, the input device 200 includes no static area of contact between the bottom surface 206 and the sensor electrodes 208 when the elastomeric material 205 is in its static shape. FIG. 2B is a cross-sectional, side view of an input device 200a in accordance with embodiments. The input device 200a is configured similarly to the input device 200, with the exception that the inner portion 217 contacts the sensor electrodes 208 when the elastomeric material 205 is in its static shape. Thus, the input device 200a includes a static area of contact 212 between the bottom surface 206 and the sensor electrodes 208. The static area of contact 212 can be controlled by varying the curvature of the bottom surface 206, height of the inner portion 217 with respect to the top surface 204, and/or height of the elastomeric material 205 with respect to the substrate 202.

Figure 2C:
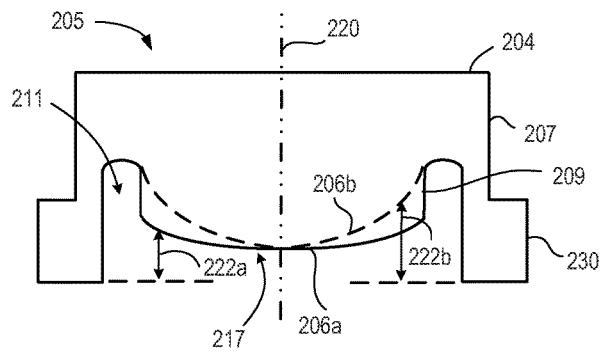
FIG. 2C is a cross-sectional, side view of elastomeric material of an input device in accordance with embodiments.

FIG. 2C is a cross-sectional, side view of the elastomeric material 205 in accordance with embodiments. Both the elastomeric material 205, and the inner portion 217 thereof, are generally symmetrical about a center axis 220. The interface between the inner portion 217 and the sensor electrodes 208 can be changed by varying the curvature of the bottom surface 206. For example, the inner portion 217 can have a flatter bottom surface 206a, or a more curved bottom surface 206b shown in phantom. Increasing the curvature of the bottom surface 206 increases the separation between an edge region of the inner portion 217 and the sensor electrodes. For example, at a given distance from the center 220, the flatter bottom surface 206a has a separation 222a from the sensor electrodes 208, and the more curved bottom surface 206b has a greater separation 222b from the sensor electrodes 208. As discussed below, the processing system 110 measures capacitance using the sensor electrodes 208. Changing the area of contact between the inner portion 217 and the sensor electrodes 208 changes the dielectric affecting the sensor electrodes 208, which in turns affects the capacitance between sensor electrodes 208. Unless completely flattened over the sensor electrodes 208 by a force applied to the top surface 204, the curvature of the bottom surface 206 causes a dielectric gradient from the center 220 to the edge of the inner portion 217. Increasing or decreasing the curvature of the bottom surface 206 can increase or decrease the dielectric gradient.

Figure 2D:
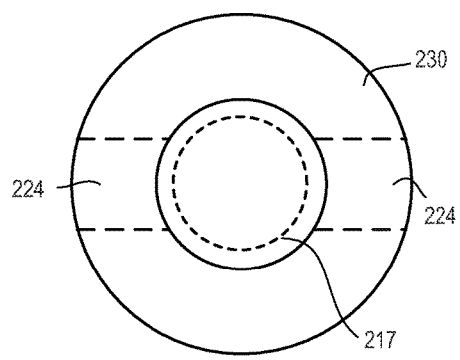
FIG. 2D is a bottom-view of the elastomeric material of FIG. 2C in accordance with embodiments.

FIG. 2D is a bottom-view of the elastomeric material 205 in accordance with embodiments. Due to the cavity 211, the elastomeric material 205 can be vented so that the elastomeric material 205 can restore its static shape after being deformed. Venting allows the pressure to equalize between the cavity 211 and outside of the elastomeric material 205. In embodiments, the elastomeric material 205 can include aperture(s) 224 formed in the flange 230 to vent the cavity 211 to the outside. In other embodiments, the substrate 202 can include aperture(s) 225 formed therein to vent the cavity to the outside. In still other embodiments, both the aperture(s) 224 and the aperture(s) 225 can be provided to vent the cavity 211.

Figure 2E:
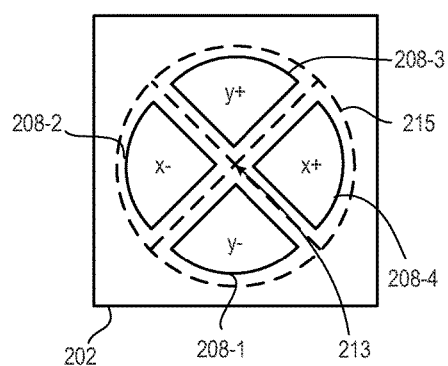
FIG. 2E is a top-view of a substrate of the input device of FIGS. 2A and 2B in accordance with embodiments.

FIG. 2E is a top-view of the substrate 202 in accordance with embodiments, where the elastomeric material 205 has been omitted for clarity. The substrate 202 includes a sensor electrode area 215 forming at least a part of a sensing region for the input device 200. The sensor electrode area 215 is divided into quadrants designated y−, x−, y+, and x+. The sensor electrodes 208 are disposed within the sensor electrode area 215. The sensor electrodes 208 are ohmically isolated from one another. In the present example, four sensor electrodes 208-1 through 208-4 are disposed in the sensor electrode area 215. The sensor electrodes 208 are shown schematically in FIG. 2D such that each electrode 208 is disposed in a different quadrant of the sensor electrode area 215. This allows the processing system 110 to detect relative changes in capacitance between different quadrants of the sensor electrode area 215, which can correlate to x/y changes in direction of a user interface indicator. In general, the input device 200 can include three or more sensor electrodes 208 that can be disposed in the sensor electrode area 215 in a configuration that allows detection of relative change in capacitance between the quadrants of the sensor electrode area 215. The elastomeric material 205 can be mounted to the substrate 202 such that the center 220 of the inner portion 217 is generally aligned with a center 213 of the area 215 in which the sensor electrodes 208 are disposed. The side wall 209 (edge) of the inner portion 217 can be aligned to the edge of the area 215, can be aligned inside of the edge of the area 215, or can be aligned outside of the edge of the area 215. Various embodiments of sensor electrode structures are described below.

Figure 3A:
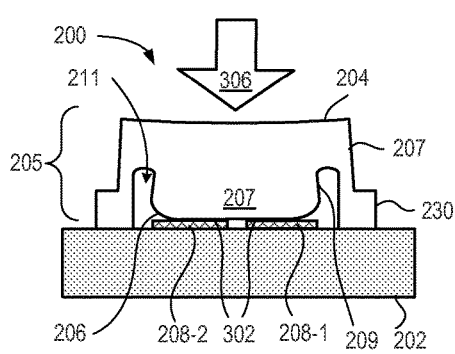
FIGS. 3A and 3B illustrate operation of an input device in response to applied force in accordance with embodiments.
Figure 3B:
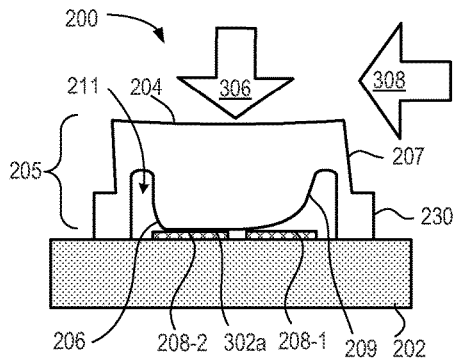

FIGS. 3A and 3B illustrate operation of the input device 200 in response to applied force in accordance with embodiments. As described further below, the processing system 110 drives the sensor electrodes 208 in accordance with one or more excitation schemes to sense capacitance. The sensed capacitance changes in response to a change in the area of contact between the inner portion 217 and the sensor electrodes 208. In FIG. 3A, a vertical force 306 is applied to the top surface 204. In the present example, the vertical force 306 is generally aligned with the center of the elastomeric material 205 (e.g., there is no lateral or shear force). The vertical force 306 deforms the elastomeric material 205 from its static shape, causing a change in an area of contact between the inner portion 217 and the sensor electrodes 208 (e.g., establishes an area of contact 302). As discussed above, when the elastomeric material 205 is in its static shape, the inner portion 217 can be configured with a static area of contact with the sensor electrodes 208, or can be separated from the sensor electrodes 208. In either case, the area of contact 302 increases in response to the vertical force 306. The area of contact 302 is evenly divided among the quadrants of the sensor electrode area 215. In general, the vertical force 306 causes the inner portion 217 to flatten out over the sensor electrodes 208 and bulge into the cavity 211. An increase in the vertical force 306 causes an increase in the area of contact 302. Conversely, a decrease in the vertical force 306 causes a decrease in the area of contact 302. Removal of the vertical force 306 restores the elastomeric material 205 to its static shape and restores the static area of contact (if any).

In FIG. 3B, a lateral force 308 is applied to the top surface 204 along with the vertical force 306, if any. The forces 306 and 308 deform the elastomeric material 205 from its static shape, causing a change in area of contact between the inner portion 217 and the sensor electrodes 208 (e.g., establishes an area of contact 302a). Due to the lateral force 308, the area of contact 302a is not evenly divided among the quadrants of the sensor electrode area 215. Rather, the inner portion 217 contacts some sensor electrodes (e.g., the sensor electrode 208-2) more than other sensor electrodes (e.g., the sensor electrode 208-1). Increasing in the lateral force 308 increases the asymmetry in the area of contact across the sensor electrodes 208. Conversely, decreasing in the lateral force 308 decreases the asymmetry in the area of contact across the sensor electrodes 208. Removal of the forces 306 and 308 restores the elastomeric material 205 to its static shape and restores the static area of contact (if any).

Figure 4A:
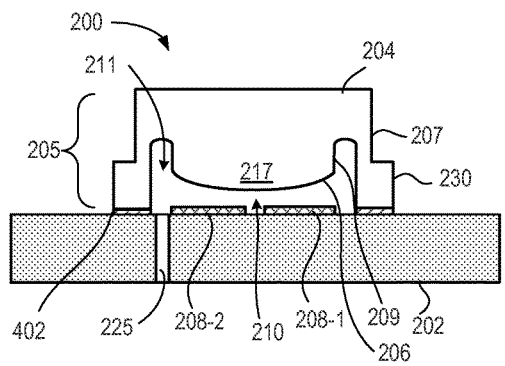
FIG. 4A is a cross-sectional, side view showing one technique for mounting elastomeric material to a substrate in accordance with embodiments.

FIG. 4A is a cross-sectional, side view of the input device 200 showing one technique for mounting the elastomeric material 205 to the substrate 202 in accordance with embodiments. The flange 230 of the elastomeric material 205 can be secured to the substrate 202 using adhesive 402. In some embodiments (described below with respect to FIG. 5E), the flange 230 can be conductive, in which case the adhesive 402 also can be conductive. The mounting technique in FIG. 4A can also be used to mount the input device 200a in the same manner.

Figure 4B:
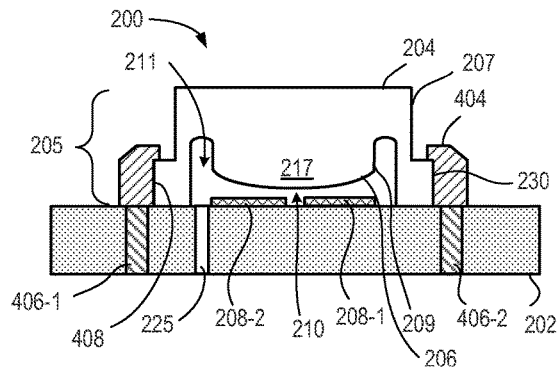
FIG. 4B is a cross-sectional, side view showing another technique for mounting elastomeric material to a substrate in accordance with embodiments.

FIG. 4B is a cross-sectional, side view of the input device 200 showing another technique for mounting the elastomeric material 205 to the substrate 202 in accordance with embodiments. A mounting fixture (e.g., "mounting ring 404") is mechanically coupled to the substrate 202 and is configured to substantially surround the elastomeric material 205. For example, the mounting ring 404 can be mechanically coupled to the substrate 202 using one or more mounting pins 406 (e.g., two mounting pins 406-1 and 406-2 are shown). The mounting pins 406 can be heat staked, ultrasonically welded, or the like to secure the mounting ring 404 to the substrate 202. The mounting ring 404 includes a channel 408 adapted to interface with the flange 230 of the elastomeric material 205. The elastomeric material 205 can be flexed into the mounting ring 404 such that the flange 230 fits into the channel 408. The mounting ring 404 holds the elastomeric material 205 in place over the sensor electrodes 208. In this manner, no adhesive is required to secure the elastomeric material 205 to the substrate 202, and the elastomeric material 205 can be detachably-mounted to the substrate 202. The mounting technique in FIG. 4B can also be used to mount the input device 200a in the same manner.

Figure 5A:
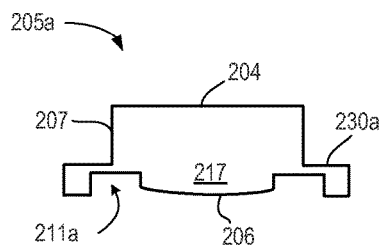
FIGS. 5A through 5E are cross-sectional, side views showing various embodiments of elastomeric material for use on an input device.
Figure 5B:
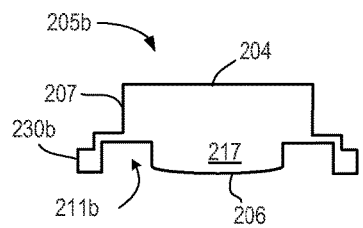
Figure 5C:
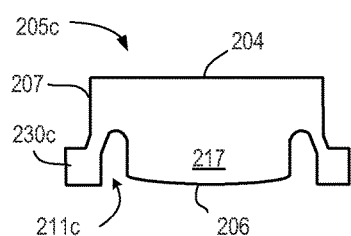

FIGS. 5A through 5E are cross-sectional, side views showing various embodiments of the elastomeric material 205. FIG. 5A shows an elastomeric material 205a configured similarly to the elastomeric material 205 described above, with the exception of the flange 230a and the cavity 211. The elastomeric material 205a includes a flange 230a defining a cavity 211a. The cavity 211 is taller, thinner, and more rounded than a cavity 211a of the elastomeric material 205a, which is flatter, wider, and more rectangular. FIG. 5B shows an elastomeric material 205b configured similarly to the elastomeric material 205a described above, with the exception of the flange 230a and the cavity 211a. A flange 230b defines a cavity 211b of the elastomeric material 205b that is taller than the cavity 211a. FIG. 5C shows an elastomeric material 205c configured similarly to the elastomeric material 205 described above, with the exception of the flange 230 and the cavity 211. A flange 230c defines a cavity 211c of the elastomeric material 205c that is wider than the cavity 211 of the elastomeric material 205. In general, the shape of the cavity between the inner portion 217 and the side wall 207 can be adjusted by changing the shape of the flange 230. FIGS. 5A-5C show but three possible examples of different flange/cavity configurations for the elastomeric material 205 described herein.

Figure 5D:
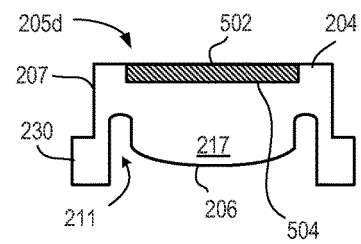

FIG. 5D shows an elastomeric material 205d configured similarly to the elastomeric material 205 described above, with the exception of an elastomeric insert 502 configured to interface with a slot 504 in the top surface 204. The elastomeric insert 502 can be detachably-mounted in the elastomeric material 205d (e.g., held in the slot 504 by friction). The elastomeric insert 502 provides a way to change the color, feel, etc. of the input surface.

Figure 5E:
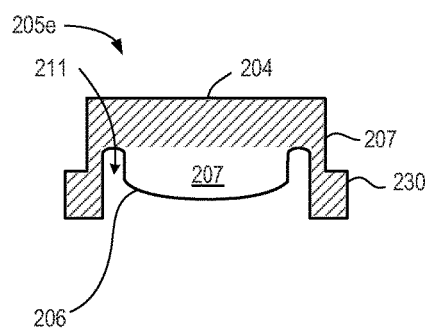

FIG. 5E shows an elastomeric material 205e configured similarly to the elastomeric material 205 described above, with the exception that the elastomeric material 205e includes both conductive and non-conductive portions. In some embodiments, the elastomeric material 205 is completely non-conductive (e.g., formed entirely of a dielectric elastomer). In other embodiments, the inner portion 217 is non-conductive, and the remaining portion of the elastomeric material 205e is conductive. In still other embodiments, the elastomeric material 205 is completely conductive (e.g. coated in a conductive material or loaded with conductive particles). The conductive portion of the elastomeric material 205e can be coupled to a reference voltage, such as electrical ground. For example, the conductive portion of the elastomeric material 205 can be coupled to the reference voltage through the interface between the flange 230 and the substrate 202, and/or through the interface between an input object (not shown) and the top surface 204.

The elastomeric material 205e can be used in embodiments where the sensor electrodes 208 are driven with an absolute capacitive sensing scheme, as discussed below.

Figure 6:
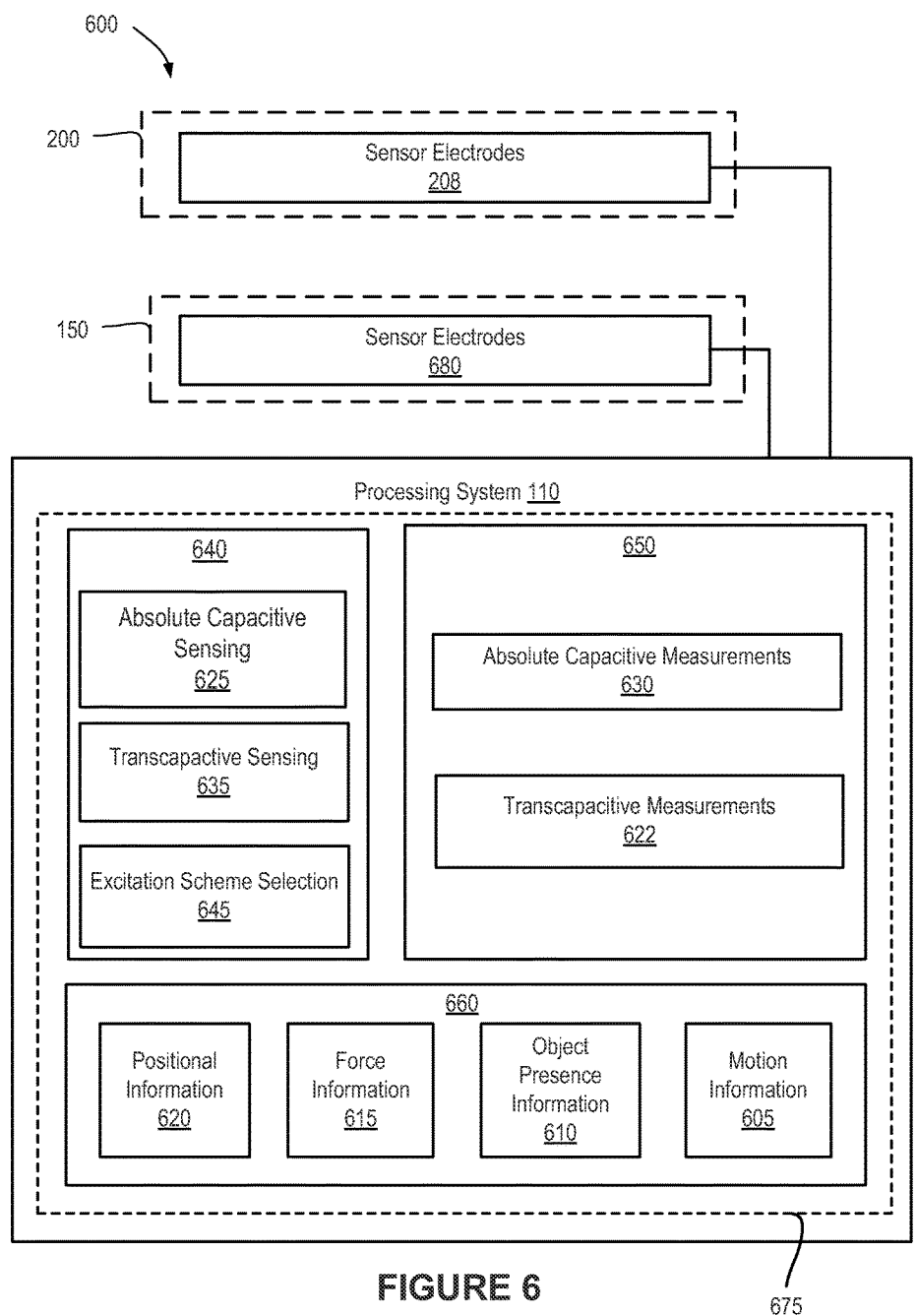
FIG. 6 is a block diagram of an input device according to an example implementation.

FIG. 6 is a block diagram of an input device 600 according to an example implementation. The input device 600 comprises an example implementation of the input device 100 shown in FIG. 1. The input device 600 includes the pointing stick 180 coupled to the processing system 110. The pointing stick 180 can include the input device 200 or the input device 200a described above. Accordingly, the pointing stick 180 includes the sensor electrodes 208 configured in the sensor electrode area 215, as described above. In some embodiments, the processing system 110 is further coupled to a two-dimensional capacitive input device, such as the proximity sensor device 150. The proximity sensor device 150 can include a two-dimensional array of sensor electrodes 680 that can be used for capacitive sensing of input. Thus, the processing system 110 can drive sensor electrodes of the pointing stick 180 or, in some embodiments, sensor electrodes of both the pointing stick 180 and the proximity sensor device 150.

In general, the processing system 110 excites or drives sensor electrodes with a capacitive sensing signal and measures an induced or resulting signal. The terms "excite" and "drive" as used herein encompasses controlling some electrical aspect of the driven element. For example, it is possible to drive current through a wire, drive charge into a conductor, drive a substantially constant or varying voltage waveform onto an electrode, etc. A capacitive sensing signal can be constant, substantially constant, or varying over time, and generally includes a shape, frequency, amplitude, and phase. A capacitive sensing signal can be referred to as an "active signal" as opposed to a "passive signal," such as a ground signal or other reference signal. A capacitive sensing signal can also be referred to as a "transmitter signal" when used in transcapacitive sensing, or an "absolute capacitive sensing signal" or "modulated signal" when used in absolute sensing.

In an example, the processing system 110 drives sensor electrode(s) with a voltage and senses resulting respective charge on sensor electrode(s). That is, the capacitive sensing signal is a voltage signal and the resulting signal is a charge signal (e.g., a signal indicative of accumulated charge, such as an integrated current signal). Capacitance is proportional to applied voltage and inversely proportional to accumulated charge. The processing system 110 can determine measurement(s) of capacitance from the sensed charge. In another example, the processing system 110 drives sensor electrode(s) with charge and senses resulting respective voltage on sensing electrode(s). That is, the capacitive sensing signal is a signal to cause accumulation of charge (e.g., current signal) and the resulting signal is a voltage signal. The processing system 110 can determine measurement(s) of capacitance from the sensed voltage. In general, the term "capacitive sensing signal" is meant to encompass both driving voltage to sense charge and driving charge to sense voltage, as well as any other type of signal that can be used to obtain indicia of capacitance. "Indicia of capacitance" include measurements of charge, current, voltage, and the like, as well as measurements of a change in charge, current, voltage, and the like with respect to a baseline, from which capacitance or change in capacitance can be derived.

The processing system 110 can include a sensor module 640, a capacitive measurer module 650, and a position determiner module 660. The sensor module 640, the capacitive measurer module 650, and the position determiner module 660 comprise modules that perform different functions of the processing system 110. In other examples, different configurations of modules can perform the functions described herein. The sensor module 640, the capacitive measurer module 650, and the position determiner module 660 can be implemented using sensor circuitry 675 and can also include firmware, software, or a combination thereof operating in cooperation with the sensor circuitry 675.

The sensor module 640 selectively drives signal(s) on one or more sensor electrodes over one or more cycles ("excitation cycles") in accordance with one or more schemes ("excitation schemes"). Each excitation cycle has an associated time period during which signals are driven and measured. During each excitation cycle, the sensor module 640 can selectively sense resulting signal(s) from one or more sensor electrodes. The sensor module 640 can include an excitation scheme selection module 645 configured to select a particular excitation scheme for a given set of sensor electrodes (e.g., the sensor electrodes 208 and/or the sensor electrodes 680). Example excitation schemes for different configurations of the sensor electrodes 208 are described below.

In one type of excitation scheme, the sensor module 640 can selectively drive sensor electrodes for absolute capacitive sensing. The sensor module 640 can include an absolute capacitive sensing module 625 to perform absolute capacitive sensing. In absolute capacitive sensing, the sensor module 640 drives selected sensor electrode(s) with an absolute capacitive sensing signal and senses resulting signal(s) from the selected sensor electrode(s). In such an excitation scheme, measurements of absolute capacitance for the selected sensor electrode(s) are determined from the resulting signal(s). In an example, the sensor module 640 can drive selected sensor electrodes 208, and/or selected sensor electrodes 680, with an absolute capacitive sensing signal.

In another type of excitation scheme, the sensor module 640 can selectively drive sensor electrodes for transcapacitive sensing. The sensor module 640 can include a transcapacitive sensing module 635. In transcapacitive sensing, the sensor module 640 drives selected transmitter sensor electrodes with transmitter signals and senses resulting signals from selected receiver sensor electrodes. In such an excitation scheme, measurements of transcapacitance between transmitter and receiver electrodes are determined from the resulting signals. In an example, the sensor module 640 can drive selected sensor electrodes 208 with transmitter signals and receive resulting signals on others of the sensor electrodes 208. Likewise, the sensor module 640 can drive selected sensor electrodes 480 with transmitter signals and receive resulting signals on others of the sensor electrodes 208.

In any excitation cycle, the sensor module 640 can drive sensor electrodes of with other signals, including reference signals and guard signals. That is, those sensor electrodes that are not driven with a capacitive sensing signal, or sensed to receive resulting signals, can be driven with a reference signal, a guard signal, or left floating (i.e., not driven with any signal). A reference signal can be a ground signal (e.g., system ground) or any other constant or substantially constant voltage signal. A guard signal can be a signal that is similar or the same in at least one of shape, amplitude, frequency, or phase of a transmitter signal. Electrically floating an electrode can be interpreted as a form of guarding in cases where, by floating, the electrode receives a desired guard signal via capacitive coupling from another electrode.

"System ground" may indicate a common voltage shared by system components. For example, a capacitive sensing system of a mobile phone can, at times, be referenced to a system ground provided by the phone's power source (e.g., a charger or battery). The system ground may not be fixed relative to earth or any other reference. For example, a mobile phone on a table usually has a floating system ground. A mobile phone being held by a person who is strongly coupled to earth ground through free space may be grounded relative to the person, but the person-ground may be varying relative to earth ground. In many systems, the system ground is connected to, or provided by, the largest area electrode in the system. The input device 600 can be located proximate to such a system ground electrode (e.g., located above a ground plane or backplane).

The capacitive measurer module 650 performs capacitance measurements based on resulting signals obtained by the sensor module 640. The capacitive measurer module 650 can determine absolute capacitive measurements 630, and/or transcapacitive measurements 622, depending on the selected excitation scheme(s). The capacitance measurements can include changes in capacitive couplings associated with the sensor electrodes (also referred to as "changes in capacitance"). For example, the capacitive measurer module 650 can determine baseline measurements of capacitive couplings between elements without the presence of external input object(s). The capacitive measurer module 650 can then combine the baseline measurements of capacitive couplings with measurements of capacitive couplings in the presence of external input object(s) to determine changes in capacitive couplings. In another example, the sensor module 640 provides indicia of capacitance that already accounts for the baseline, and thus the capacitive measurer module 650 can determine changes in capacitance directly from such indicia of capacitance.

The position determiner module 660 processes the measurements of capacitance to sense input. For example, the position determiner module 660 can process capacitance measurements obtained from the pointing stick 180 to determine input based on changes in the area of contact between the inner portion 217 of the elastomeric material 205 and the sensor electrodes 208. As the area of contact changes based on applied vertical and/or lateral force, the position determiner module 660 can determine a position of the pointing stick 180 ("positional information 620") and/or force applied to the pointing stick 180 ("force information 615"). The position of the pointing stick 180 and/or force applied to the pointing stick 180 can be determined based on the relation between the area of contact of the inner portion 217 of the elastomeric material 205 and the sensor electrode area 215 as derived from the capacitance measurements. The determined position and/or force is used to control a user interface indicator of the electronic system. In another example, the position determiner module 660 can process capacitance measurements obtained from the pointing stick 180 to determine presence of an input object contacting or hovering over the elastomeric material 205 ("object presence information 610"). The position determiner module 660 can process capacitance measurements obtained from the proximity sensor device 150 to determine positional information 620, force information 615, and/or object presence information 610. The position determiner module 660 can use the positional information 620, the force information 615, and/or the object presence information 610 to determine motion information 605 for a user interface indicator (e.g., a cursor).

Figure 7:
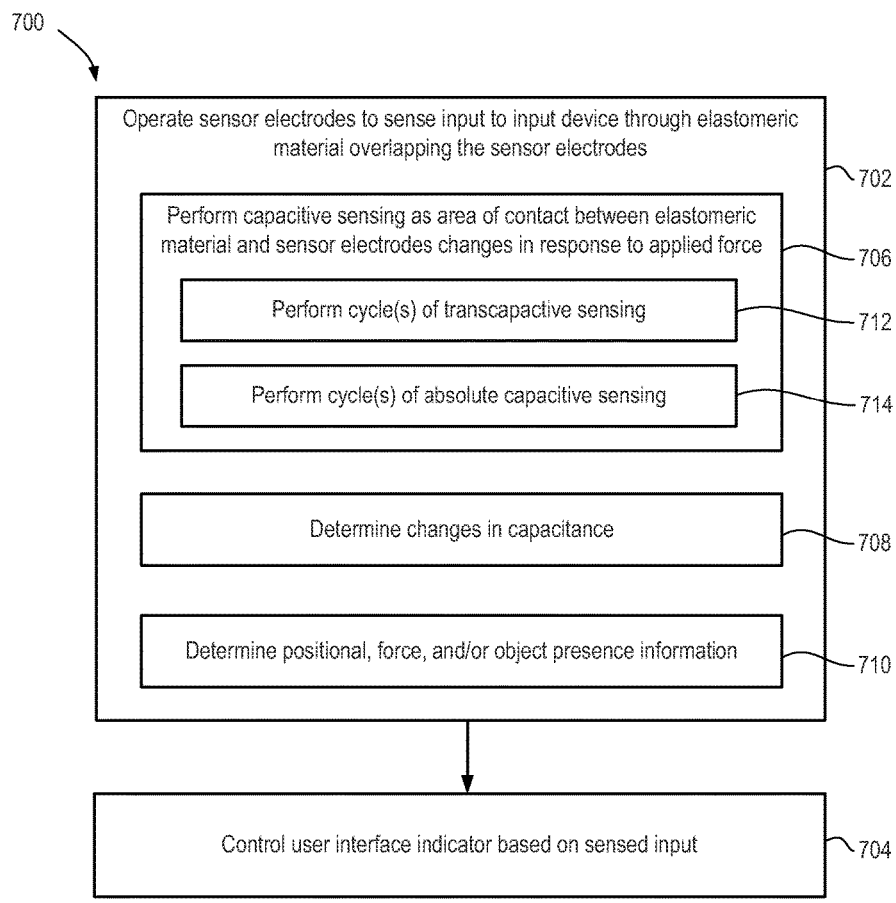
FIG. 7 is a flow diagram depicting a method of operating an input device configured to control a user interface indicator of an electronic device in accordance with embodiments.

FIG. 7 is a flow diagram depicting a method 700 of operating an input device configured to control a user interface indicator of an electronic device in accordance with embodiments. The method 700 can be performed by the input device 600 shown in FIG. 6 or other type of input device configured similarly. Aspects of the method 700 can be understood with reference to elements of FIGS. 1-6 described above. The method 700 begins at step 702, where the processing system 110 operates sensor electrodes 208 to sense input to an input device 200 (e.g., pointing stick 180) through elastomeric material 205 overlapping the sensor electrodes 208. At step 704, the processing system 110 controls a user interface indicator based on the sensed input. The user interface indicator can comprise, for example, a cursor of an electronic device.

The step 702 can include steps 706 through 710. At step 706, the processing system 110 performs capacitive sensing as area of contact between the elastomeric material 205 and the sensor electrodes 208 changes in response to applied force (e.g., vertical and/or lateral force). At step 708, the processing system 110 determines changes in capacitance based on the capacitive sensing. At step 710, the processing system 110 determines position, force, and/or object presence information based on the changes in capacitance. The step 706 can include step 712 and/or step 714. At step 712, the processing system 110 performs one or more cycles of transcapacitive sensing. At step 714, the processing system 110 performs one or more cycles of absolute capacitive sensing.

Figure 8:
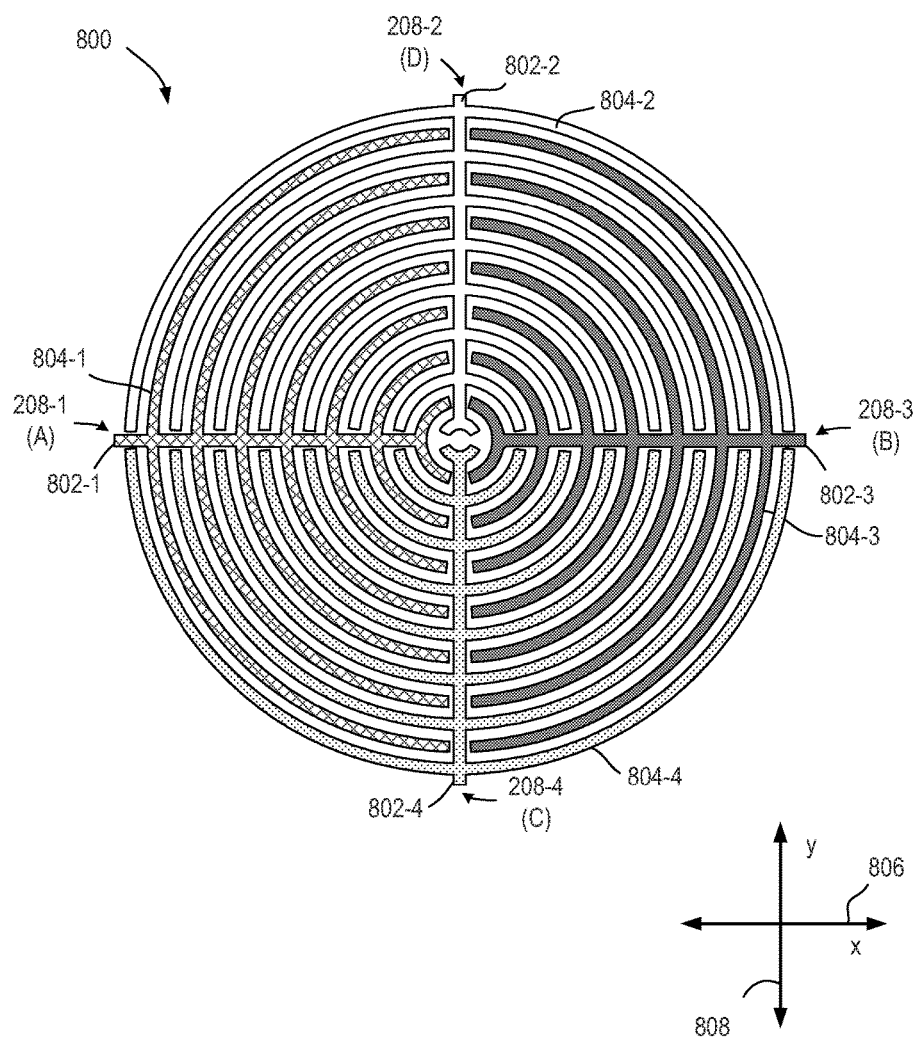
FIG. 8 is a top-view of a sensor electrode structure in accordance with embodiments.

FIG. 8 is a top-view of a sensor electrode structure 800 in accordance with embodiments. The sensor electrode structure 800 includes four sensor electrodes 208-1 through 208-4 (collectively sensor electrodes 208). Within the structure 800, the sensor electrode 208-1 is referred to as the "A" electrode, the sensor electrode 208-3 is referred to as the "B" electrode, the sensor electrode 208-4 is referred to as the "C" electrode, and the sensor electrode 208-2 is referred to as the "D" electrode. The sensor electrodes 208 are ohmically isolated from one another. Each sensor electrode 208 is driven with a signal (e.g., transmitter signal, receiver signal, modulated signal) by the processing system 110. Each of the sensor electrodes 208 includes a body and a plurality of branches. For each of the sensor electrodes 208, the body and branches are electrically coupled to form a single electrode. Thus, the sensor electrodes 208-1 through 208-4 include bodies 802-1 through 802-4 and branches 804-1 through 804-4, respectively.

In the present example, each of the sensor electrodes 208 has a generally semi-circular footprint, where the branches 804 are symmetrical about the body 802 and comprise semi-circles of successively decreasing radius. The sensor electrodes 208 are disposed such that branches 804 of any one sensor electrode 208 are interleaved with the branches 804 of two other sensor electrodes 208. For example, the branches 804-1 of the sensor electrode 208-1 are interleaved with the branches 804-2 and 804-4 of the sensor electrodes 208-2 and 208-4, respectively. The sensor electrodes 208 are disposed to define a sensing region having an x-axis 806 and a y-axis 808. Other arrangements of the sensor electrodes 208 are possible, where each sensor electrode includes a body and a plurality of branches interleaved with branches of one or more other electrode(s). The sensor electrodes 208 can be disposed on a single layer of the substrate 202 of the input device 200, on multiple layers of the substrate 202, or on multiple substrates.

With the sensor electrode structure 800, each sensor electrode 208 can be either a transmitter or a receiver in a transcapacitive sensing scheme. In general, the processing system 110 can transmit a sensing signal on at least one of the sensor electrodes 208, and receive a resulting signal from at least one of the sensor electrodes 208, where the resulting signal comprises effects of the sensing signal and a change in mutual capacitance. The change in mutual capacitance is due to the change in area of contact of the elastomeric material 205, which changes the dielectric between transmitting and receiving electrodes. As more of the elastomeric material 205 is deformed on the sensor electrodes 208, the mutual capacitance increases. The processing system 110 can then determine motion of a user interface indicator based on changes in each resulting signal caused by applied force to the elastomeric material 205.

In an embodiment, the sensor electrode structure 800 can be excited over two cycles of transcapacitive sensing. In a first cycle, two sensor electrodes 208 are transmitters, and two sensor electrodes 208 are receivers. For example, sensor electrodes 208-1 and 208-3 can be transmitters and sensor electrodes 208-2 and 208-4 can be receivers. In a second cycle, the two sensor electrodes 208 that were transmitters are now receivers, and the two sensor electrodes 208 that were receivers are now transmitters. For example, sensor electrodes 208-2 and 208-4 become transmitters, and sensor electrodes 208-1 and 208-3 become receivers. The (X, Y) elastomer position within the sensing region is given by:

$$X \propto (\Delta C_B - \Delta C_A)$$

$$Y \propto (\Delta C_D - \Delta C_C)$$

where $\Delta C_i$ is the mutual capacitance with respect to baseline sensed by the ith receiver sensor electrode, where $i \in \{A, B, C, D\}$. If the elastomeric material 205 contacts the B sensor electrode more than the A sensor electrode, the mutual capacitance sensed by the B sensor electrode will be higher, yielding a positive X position. Conversely, if the elastomeric material 205 contacts the A sensor electrode more than the B sensor electrode, the mutual capacitance sensed by the A sensor electrode will be higher, yielding a negative X position. Likewise for the C and D sensor electrodes along the Y position. The force F can be measured as $F = f(\Delta C_A + \Delta C_B + \Delta C_C + \Delta C_D)$, where $f$ is a function that can be determined empirically or through simulation. In one example, the force can be computed using supposition of linearity as $F = \alpha(\Delta C_A + \Delta C_B + \Delta C_C + \Delta C_D)$, where $\alpha$ is a constant.

In the excitation scheme discussed above for the structure 800, the X/Y measurement is immune to unison noise due to the differencing of mutual capacitance measurements. The force measurement, however, is not immune to unison noise due to the summation of mutual capacitance measurements. The force measurement can be made immune to unison noise if, for each cycle, only a single electrode is used as a transmitter and all other electrodes are used as receivers. This requires more excitation cycles to achieve (e.g., four excitation cycles, one for each of the sensor electrodes 208-1 through 208-4). In various embodiments, the excitation scheme is selected based on a combination of scanning speed (i.e., sensing frame rate) and noise criteria.

Figure 9A:
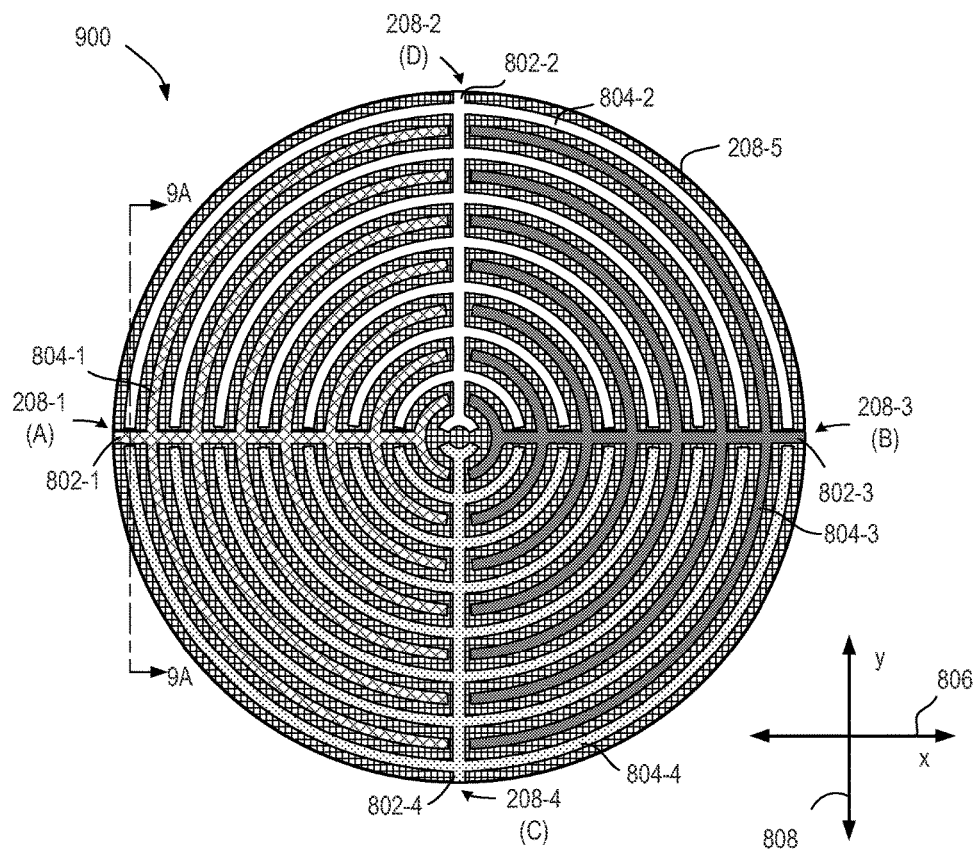
FIG. 9A is a top-view of another sensor electrode structure in accordance with embodiments.
Figure 9B:
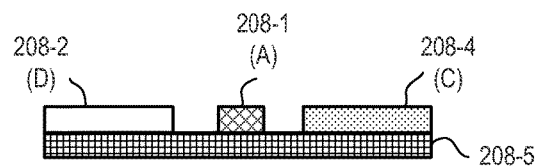
FIG. 9B is a cross-section of the sensor electrode structure of FIG. 9A taken along the line 9A-9A.

FIG. 9A is a top-view of a sensor electrode structure 900 in accordance with embodiments. The sensor electrode structure 900 includes five sensor electrodes 208-1 through 208-5 (collectively sensor electrodes 208). The sensor electrode structure 900 is configured similarly to the sensor electrode structure 800 of FIG. 8, with the exception of the additional sensor electrode 208-5 disposed on another layer above or below the layer(s) having the sensor electrodes 208-1 through 208-4. For example, FIG. 9B is a cross-section of the sensor electrode structure 900 taken along the line 9A-9A. In the example, the sensor electrodes 208-1 through 208-4 are on a single layer, and the sensor electrode 208-5 is on a layer below the sensor electrodes 208-1 through 208-4, ohmically isolated from each other by a dielectric (not shown). In an embodiment, the sensor electrode 208-5 can be a disc-shaped electrode generally coextensive with the sensor electrodes 208-1 through 208-4.

With the sensor electrode structure 900, the sensor electrode 208-5 is a transmitter and each sensor electrode 208-1 through 208-4 is a receiver in a transcapacitive sensing scheme. The processing system 110 can excite the structure 900 in similar fashion to the structure 800, but using a single excitation cycle. The receiver electrodes 208-1 through 208-4 are sensed in the single cycle, and the processing system 110 can determine the (X,Y) position and/or force from the mutual capacitance measurements from the single cycle. However, the electrode structure 900 requires use of multiple substrate layers or multiple substrates.

Figure 10:
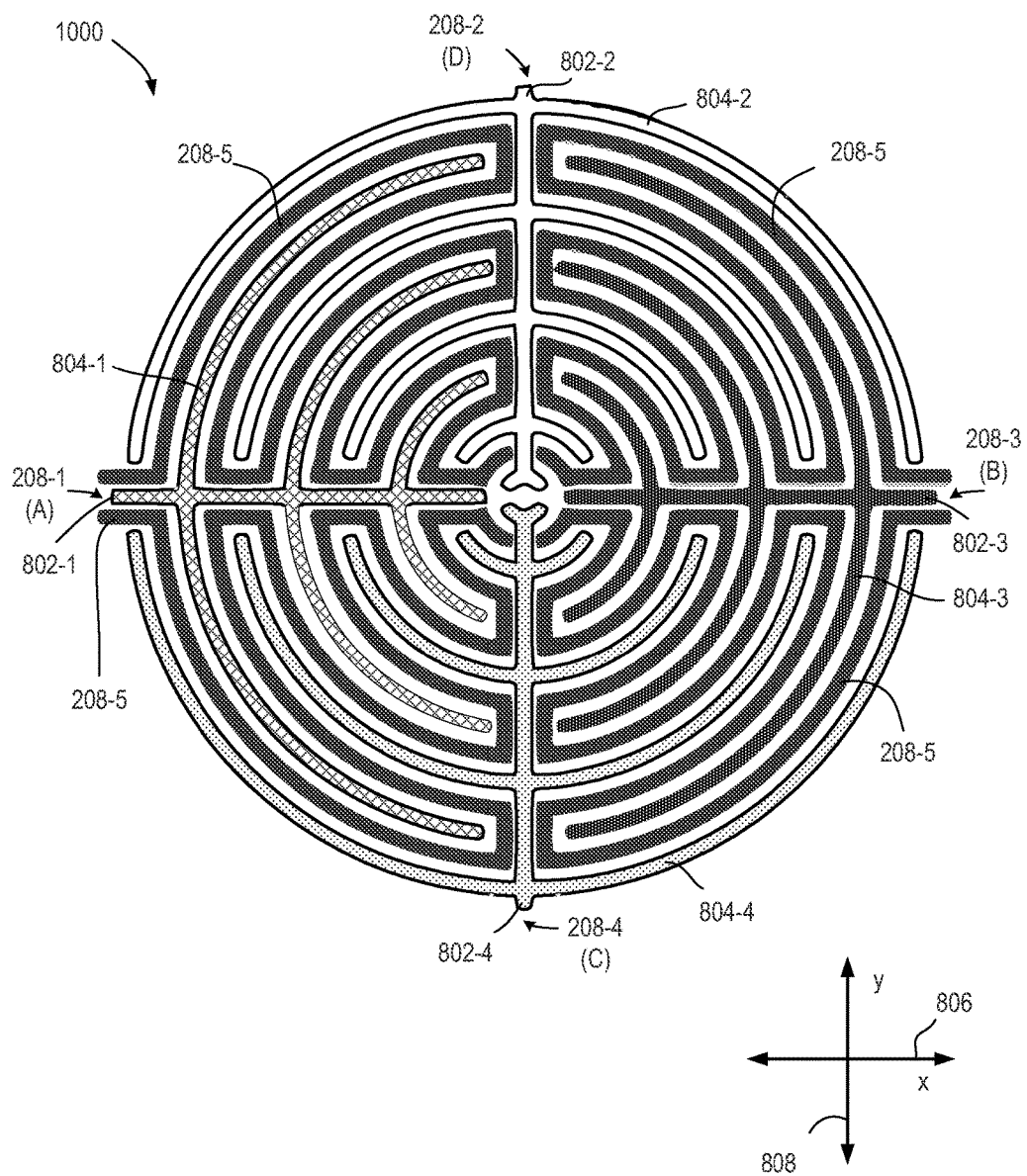
FIG. 10 is a top-view of yet another sensor electrode structure in accordance with embodiments.

FIG. 10 is a top-view of a sensor electrode structure 1000 in accordance with embodiments. The sensor electrode structure 1000 includes five sensor electrodes 208-1 through 208-5 (collectively sensor electrodes 208). The sensor electrode structure 1000 is configured similarly to the sensor electrode structure 900 FIG. 9, with the exception of the sensor electrode 208-5 is not formed on a separate layer. Rather, the sensor electrode 208-5 is formed as an electrode interleaved with the sensor electrodes 208-1 through 208-4. In this manner, the (X,Y) position and/or force can be determined in a single excitation cycle using a sensor electrode structure formed on a single layer. However, the pitch between branches 804 of the sensor electrodes 208-1 through 208-4 is increased due to the interleaved sensor electrode 208-5. An increase in pitch results in a decrease of signal-to-noise ratio of the resulting signals.

Figure 11:
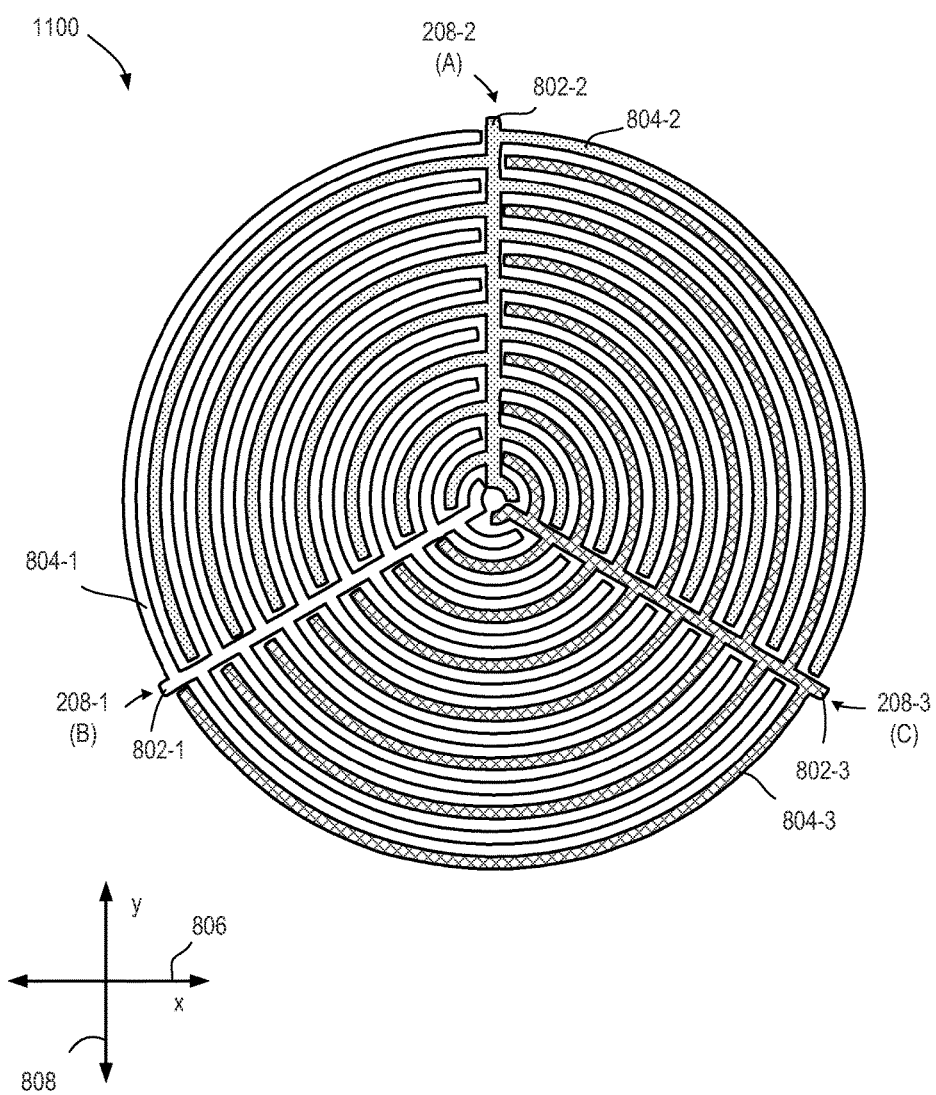
FIG. 11 is a top-view of still another sensor electrode structure in accordance with embodiments.

FIG. 11 is a top-view of a sensor electrode structure 1100 in accordance with embodiments. The sensor electrode structure 1100 includes three sensor electrodes 208-1 through 208-3. Within the structure 1100, the sensor electrode 208-2 is referred to as the "A" electrode, the sensor electrode 208-1 is referred to as the "B" electrode, the sensor electrode 208-3 is referred to as the "C" electrode. The sensor electrodes 208 are ohmically isolated from one another. Each sensor electrode 208 is driven with a signal (e.g., transmitter signal, receiver signal, modulated signal) by the processing system 110. Each of the sensor electrodes 208 includes a body and a plurality of branches. For each of the sensor electrodes 208, the body and branches are electrically coupled to form a single electrode. Thus, the sensor electrodes 208-1 through 208-3 include bodies 802-1 through 802-3 and branches 804-1 through 804-3, respectively. In the present example, each of the sensor electrodes 208 has a generally semi-circular footprint similar to the structures 800, 900, and 1000 described above. In addition, the sensor electrodes 208 are disposed such that branches 804 of any one sensor electrode 208 are interleaved with the branches 804 of two other sensor electrodes 208. The sensor electrodes 208 can be disposed on a single layer of the substrate 202 of the input device 200, on multiple layers of the substrate 202, or on multiple substrates.

With the sensor electrode structure 1100, each sensor electrode 208 can be either a transmitter or a receiver in a transcapacitive sensing scheme. In general, the processing system 110 can transmit a sensing signal on at least one of the sensor electrodes 208, and receive a resulting signal from at least one of the sensor electrodes 208, where the resulting signal comprises effects of the sensing signal and a change in mutual capacitance. The change in mutual capacitance is due to the change in area of contact of the elastomeric material 205, which changes the dielectric between transmitting and receiving electrodes. As more of the elastomeric material 205 is deformed on the sensor electrodes 208, the mutual capacitance increases. The processing system 110 can then determine motion of a user interface indicator based on changes in each resulting signal caused by applied force to the elastomeric material 205.

In an embodiment, the sensor electrode structure 1100 can be excited over three cycles of transcapacitive sensing. In a first cycle, sensor electrode (A) is a transmitter and sensor electrodes (B) and (C) are receivers. In a second cycle, sensor electrode (B) is a transmitter and sensor electrodes (A) and (C) are receivers. In a third cycle, sensor electrode (C) is a transmitter and sensor electrodes (A) and (B) are receivers. The mutual capacitances measured over the three cycles can be combined in different proportions to yield an (X, Y) position and/or force. In another embodiment, three cycles of measurements are made where one electrode of the three is used as receivers and two electrodes of the three are used as transmitters.

The various sensor electrode structures are discussed above in terms of transcapacitive sensing. In other embodiments, the sensor electrode structures 800, 900, 1000, and 1100 can be used with absolute capacitive sensing. In such case, the elastomeric material 205 can include a conductive portion coupled to a substantially constant voltage (e.g., electrical ground), as discussed above with respect to FIG. 5E. The processing system 110 can measure variable capacitance (measures of absolute capacitance) of each of the sensor electrodes 208 in the presence of the conductive portion of the elastomeric material 205. The processing system 110 can then determine position and/or force using the absolute capacitance measurements in similar fashion as with the transcapacitance measurements. That is, in case of absolute sensing, when more of the inner portion 217 of the elastomeric material 205 is deformed onto sensor electrode(s), the measured absolute capacitance increases with respect to the measured absolute capacitance of other sensor electrodes.

Figure 12:
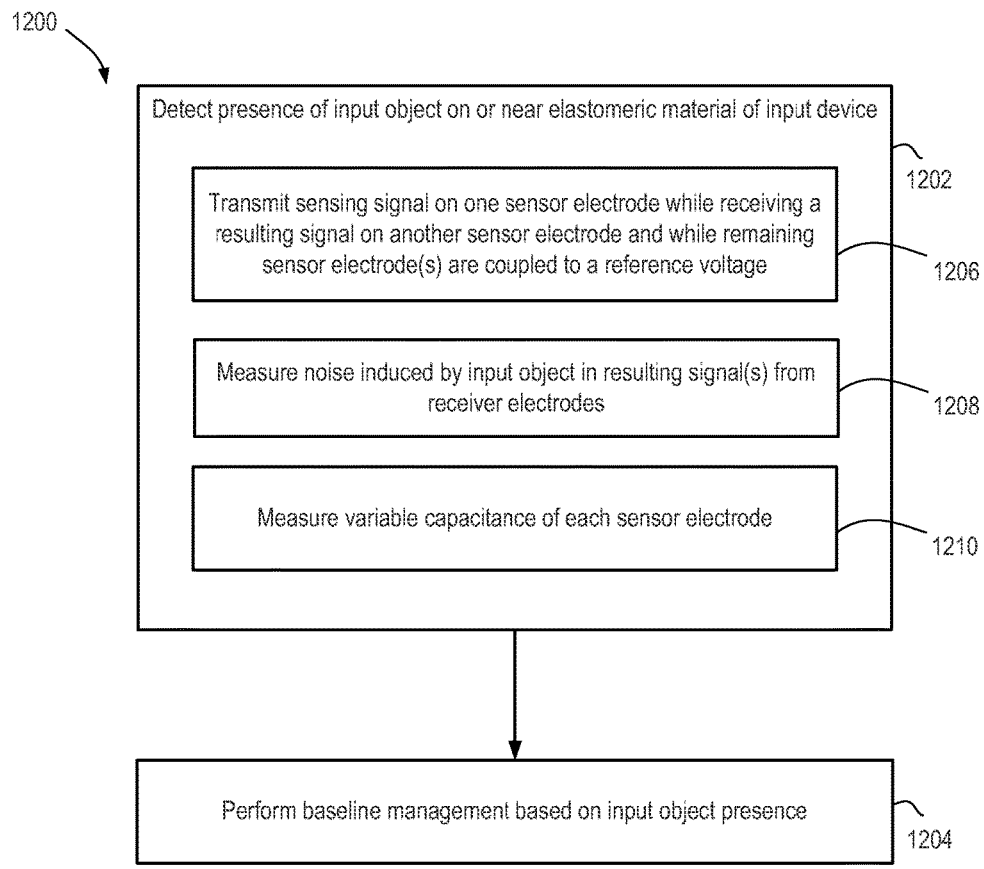
FIG. 12 is a flow diagram depicting a method of managing a baseline of an input device in accordance with embodiments.

FIG. 12 is a flow diagram depicting a method 1200 of managing a baseline of an input device in accordance with embodiments. The method 1200 can be performed by the input device 600 shown in FIG. 6 or other type of input device configured similarly. Aspects of the method 1200 can be understood with reference to elements of FIGS. 1-11 described above. The method 1200 begins at step 1202, where the processing system 110 detects presence of an input object on or near the elastomeric material 205 of the input device using proximity detection. At step 1204, the processing system 110 performs baseline management based on input object presence. For example, the processing system 110 can re-adjust or re-compute the baseline when no input object is present. In one example, step 1202 includes a step 1206, where the processing system 110 transmits a sensing signal on one sensor electrode 208 while receiving a resulting signal on another sensor electrode 208 and while remaining sensor electrode(s) 208 are coupled to a reference voltage. The measured mutual capacitance can be affected by the presence of an input object on or near the elastomeric material 205. In another example, step 1202 includes a step 1208, where the processing system 110 measures noise induced by an input object in resulting signal(s) of receiving sensor electrode(s) 208. The presence of the input object on or near the elastomeric material 205 can affect one or more mutual capacitance measurements, which can be detected as noise in the measurements. In another example, step 1202 includes a step 1210, where the processing system measures variable capacitance of each sensor electrode (absolute capacitance) and determines input object presence based on the variable capacitance measurements.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. An input device configured to control a user interface indicator of an electronic device, the input device comprising:
   a substrate having a plurality of sensor electrodes disposed thereon; and
   an elastomeric material configured to deform in response to an input force, wherein the input force is at least one of a lateral force and a vertical force, the elastomeric material comprising:
      a first dielectric portion overlapping the plurality of sensor electrodes and comprising a first side wall mechanically coupled to the substrate;
      a top surface; and
      a dielectric inner portion disposed such that an area of contact between the dielectric inner portion and at least some of the plurality of sensor electrodes changes in response to the input force, wherein the dielectric inner portion has a curved surface protruding down from the top surface toward the plurality of sensor electrodes in absence of force applied to the elastomeric material and a second side wall oriented substantially parallel to the first side wall, and wherein the dielectric inner portion is separated from the substrate and the second side wall is separated from the first side wall to form a cavity filled with air; and
   one or more vents configured to equalize pressure between the cavity and an area surrounding the elastomeric material.

2. The input device of claim 1, further comprising:
   a processing system communicatively coupled to the plurality of sensor electrodes and configured to control the user interface indicator in response to a change in the area of contact between the dielectric inner portion and at least some of the plurality of sensor electrodes.

3. The input device of claim 2, wherein the processing system is configured to:
   transmit a sensing signal on at least one of the plurality of sensor electrodes;
   receive a resulting signal from at least one of the plurality of sensor electrodes, the resulting signal comprising effects of the sensing signal and a change in mutual capacitance; and
   determine motion of the user interface indicator based on changes in each resulting signal due to the at least one of the lateral force or the vertical force applied to the elastomeric material.

4. The input device of claim 2, wherein the elastomeric material comprises a conductive portion having a substantially constant voltage applied thereto, and wherein the processing system is configured to:

measure variable capacitance of each of the plurality of sensor electrodes in the presence of the conductive portion; and determine motion of the user interface indicator based on changes of the variable capacitance of each of the plurality of sensor electrodes due to deformation of the conductive portion by the at least one of the lateral force or the vertical force applied to the elastomeric material.

5. The input device of claim 2, wherein the processing system is further configured to operate a two-dimensional capacitive input device of the electronic device.

6. The input device of claim 2, wherein the processing system is configured to:

transmit a sensing signal on each of a first subset of the plurality of sensor electrodes while receiving a resulting signal from each of a second subset of the plurality of sensor electrodes;

transmit a sensing signal on each of the second subset of the plurality of sensor electrodes while receiving a resulting signal from each of the first subset of the plurality of sensor electrodes; and determine motion of the user interface indicator based on changes in the resulting signals due to the at least one of the lateral force or the vertical force applied to the elastomeric material.

7. The input device of claim 2, wherein the processing system is configured to:

hold all but two sensor electrodes of the plurality of sensor electrodes at constant potential;

transmit a sensing signal on one of the two sensor electrodes while receiving a resulting signal from another of the two sensor electrodes, the resulting signal comprising effects of the transmitted sensing signal and a change in mutual capacitance; and determine presence of an input object on the elastomeric material based on changes in the resulting signal.

8. The input device of claim 2, wherein the processing system is configured to:

measure variable capacitance of each of the plurality of sensor electrodes; and determine presence of an input object on the elastomeric material based on changes of the variable capacitance of each of the plurality of sensor electrodes.

9. The input device of claim 1, wherein the dielectric inner portion of the elastomeric material contacts at least some of the plurality of sensor electrodes in the absence of force applied to the elastomeric material.

10. The input device of claim 1, wherein the dielectric inner portion of the elastomeric material is separated from the plurality of sensor electrodes in the absence of force applied to the elastomeric material.

11. The input device of claim 1, wherein the dielectric inner portion of the elastomeric material includes a shape configured to:

in response to an applied vertical force, deform and increase the area of contact for each of the plurality of sensor electrodes; and in response to an applied lateral force, deform and increase the area of contact for a first subset of the plurality of sensor electrodes relative to the area of contact for a second subset of the plurality of sensor electrodes.

12. The input device of claim 1, wherein the elastomeric material is mechanically coupled to the substrate with a mounting fixture substantially surrounding the elastomeric material and mechanically coupled to the substrate.

13. The input device of claim 12, wherein at least one of the mounting fixture or the substrate includes the one or more vents.

14. The input device of claim 1, wherein the plurality of sensor electrodes comprises:

at least three sensor electrodes disposed on the substrate and overlapped by the dielectric inner portion of the elastomeric material; and at least one sensor electrode disposed on the substrate overlapping the at least three sensor electrodes and separated from the at least three sensor electrodes by a dielectric.

15. The input device of claim 1, wherein the plurality of sensor electrodes comprises:

at least three sensor electrodes disposed on a layer of the substrate and overlapped by the dielectric inner portion of the elastomeric material.

16. The input device of claim 15, wherein the plurality of sensor electrodes comprises:

an additional sensor electrode disposed on the layer of the substrate and interleaved with the at least three sensor electrodes.

17. A processing system for an input device configured to control user interface indicator of an electronic device, the processing system comprising:

a sensor module including sensor circuitry, the sensor module configured to operate a plurality of sensor electrodes disposed on a substrate to sense input to the input device through an elastomeric material overlapping the plurality of sensor electrodes, the elastomeric material having a first dielectric portion comprising a first side wall mechanically coupled to the substrate, a top surface, and a dielectric inner portion opposing the plurality of sensor electrodes in absence of force applied to the elastomeric material, the inner dielectric portion having a curved surface protruding down from the top surface toward the plurality of sensor electrodes in absence of force applied to the elastomeric material and a second side wall oriented substantially parallel to the first side wall, the inner dielectric portion is separated from the substrate and the second side wall is separated from the first side wall to form a cavity filled with air, and pressure between the cavity and an area surrounding the elastomeric material is equalized by a vent; and a determination module configured to control the user interface indicator based on the sensed input indicating a change in an area of contact between the dielectric inner portion of the elastomeric material and at least some of the plurality of sensor electrodes in response to at least one of a lateral force or a vertical force applied to the elastomeric material.

18. The processing system of claim 17, wherein the sensor module is configured to:

transmit a sensing signal on at least one of the plurality of sensor electrodes;

receive a resulting signal from at least one of the plurality of sensor electrodes, the resulting signal comprising effects of a transmitted sensing signal and a change in mutual capacitance; and wherein the determination module is configured to determine motion of the user interface indicator based on changes in each resulting signal due to the at least one of the lateral force or the vertical force applied to the elastomeric material.

19. The processing system of claim 17, wherein the sensor module is configured to:
- hold all but two sensor electrodes of the plurality of sensor electrodes at a constant potential;
- transmit a sensing signal on one of the two sensor electrodes while receiving a resulting signal from another of the two sensor electrodes comprising effects of the transmitted sensing signal and a change in mutual capacitance; and
- wherein the determination module is configured to determine presence of an input object on the elastomeric material based on changes in the resulting signal.

20. A method of operating an input device configured to control a user interface indicator of an electronic device, the method comprising:
- operating a plurality of sensor electrodes disposed on a substrate to sense input to the input device through an elastomeric material overlapping the plurality of sensor electrodes, the elastomeric material having a first dielectric portion comprising a first side wall mechanically coupled to the substrate, a top surface and a dielectric inner portion opposing the plurality of sensor electrodes in absence of force applied to the elastomeric material, the inner dielectric portion having a curved surface protruding down from the top surface toward the plurality of sensor electrodes in absence of force applied to the elastomeric material and a second side wall oriented substantially parallel to the first side wall, the inner dielectric portion is separated from the substrate and the second side wall is separated from the first side wall to form a cavity filled with air and pressure between the cavity and an area surrounding the elastomeric material is equalized by a vent; and
- controlling the user interface indicator based on the sensed input indicating a change in an area of contact between the dielectric inner portion of the elastomeric material and at least some of the plurality of sensor electrodes in response to at least one of a lateral force or a vertical force applied to the elastomeric material.

* * * * *